(12) United States Patent  (10) Patent No.: US 7,815,815 B2
Miyata  (45) Date of Patent: Oct. 19, 2010

(54) METHOD AND APPARATUS FOR PROCESSING THE PERIPHERAL AND EDGE PORTIONS OF A WAFER AFTER PERFORMANCE OF A SURFACE TREATMENT THEREON

(75) Inventor: Koji Miyata, Mahopac, NY (US)

(73) Assignees: Sony Corporation, Toyko (JP); Sony Electronics Inc., Park Ridge, NJ (US)

( * ) Notice: Subject to any disclaimer, the term of this patent is extended or adjusted under 35 U.S.C. 154(b) by 918 days.

(21) Appl. No.: 11/497,143

(22) Filed: Aug. 1, 2006

(65) Prior Publication Data
US 2008/0032043 A1  Feb. 7, 2008

(51) Int. Cl.
*B44C 1/22* (2006.01)
(52) U.S. Cl. .............. 216/79; 216/58; 216/67; 438/706
(58) Field of Classification Search ............ 216/58, 216/67, 79; 438/706, 710, 7
See application file for complete search history.

(56) References Cited

U.S. PATENT DOCUMENTS 7,119,011 B2 * 10/2006 Harada et al. ............ 438/640

| | | | |
|---|---|---|---|
| 2002/0061649 A1 | 5/2002 | Nishida | 438/689 |
| 2003/0027427 A1 | 2/2003 | Ma et al. | 438/700 |
| 2003/0045131 A1 | 3/2003 | Verbeke et al. | 438/795 |
| 2003/0100190 A1 | 5/2003 | Cote et al. | 438/710 |
| 2004/0238488 A1 * | 12/2004 | Choi et al. | 216/58 |
| 2005/0153533 A1 | 7/2005 | Hoshino et al. | 438/618 |
| 2005/0272265 A1 | 12/2005 | Geffken et al. | 438/706 |
| 2005/0284576 A1 * | 12/2005 | America et al. | 156/345.43 |
| 2005/0287811 A1 | 12/2005 | Inukai | 438/700 |
| 2006/0000804 A1 | 1/2006 | Oyama et al. | 216/67 |
| 2006/0260748 A1 * | 11/2006 | Nogami et al. | 156/345.33 |

* cited by examiner

*Primary Examiner*—Lan Vinh
(74) *Attorney, Agent, or Firm*—Stuart H. Mayer, Esq.; Karin L. Williams, Esq.; Mayer & Williams PC

(57) ABSTRACT

A surface processing method includes supporting a wafer in a vacuum chamber and generating a plasma in a confined portion of the chamber over only a selected portion of the wafer to thereby perform a surface processing treatment (e.g., an ashing process) on the selected portion of the wafer. While the plasma is being generated, the wafer and the confined portion of the chamber are displaced with respect to one another to thereby perform the surface processing treatment on a second selected portion of the wafer.

11 Claims, 6 Drawing Sheets

METHOD AND APPARATUS FOR PROCESSING THE PERIPHERAL AND EDGE PORTIONS OF A WAFER AFTER PERFORMANCE OF A SURFACE TREATMENT THEREON

FIELD OF THE INVENTION

The present invention relates generally to a method and apparatus for performing a surface treatment process, and more particularly to a method and apparatus for performing a plasma ashing process to remove a resist material or the like from a semiconductor wafer.

BACKGROUND OF THE INVENTION

The manufacture of integrated circuits (ICs) in a semiconductor device involves the formation of a sequence of layers that contain metal wiring. Metal interconnects and vias which form horizontal and vertical connections in the device are separated by insulating layers or inter-level dielectric layers (ILDs) to prevent crosstalk between the metal wiring that can degrade device performance. A popular method of forming an interconnect structure is a dual damascene process in which vias and trenches are filled with metal in the same step to create multi-level, high density metal interconnections needed for advanced high performance integrated circuits. The most frequently used approach is a via first process in which a via is formed in a dielectric layer and then a trench is formed above the via. Recent achievements in dual damascene processing include lowering the resistivity of the metal interconnect by switching from aluminum to copper, decreasing the size of the vias and trenches with improved lithographic materials and processes to improve speed and performance, and reducing the dielectric constant (k) of insulators or ILDs by using so-called low-k materials to avoid capacitance coupling between the metal interconnects. The expression "low-k" material has evolved to characterize materials with a dielectric constant less than about 3.9. One class of low-k material that have been explored are organic low-k materials, typically having a dielectric constant of about 2.0 to about 3.8, which may offer promise for use as an ILD.

During a dual damascene process, there are typically four etches: via, trench, photoresist and polymer strip, and bottom barrier removal. Each has challenges irrespective of damascene strategy. For example, during the via etch, selectivity of the resist, selectivity of the bottom barrier and profile in the bottom of the via are critical. During the trench etch it is important to maintain the integrity of the bottom barrier without impacting the desired lateral dimensions of the trench. With regard to photoresist and polymer removal, the process of removing the photoresist mask, polymers and post etch residues after the features have been etched into the substrate is generally known as stripping or ashing. The stripping or ashing process should exhibit high selectivity since small deviations in the etched profiles can adversely impact device performance, yield and reliability of the final integrated circuit. Since many of the low-k dielectrics contain carbon within their structure, current processes exhibit reduced selectivity. Moreover, the current processes for ashing or stripping photoresist from new low-k ILD materials can cause damage to the material. For example, ashing can result in pullback of the dielectric film and/or cause an increase in the effective k value of the dielectric film.

In a conventional ashing process, an oxygen-containing gas is introduced into the chamber, and the RF electric power is applied to the chamber or the like to activate the gas so that it is transformed into a plasma. The gas may be an almost pure oxygen gas, an ozone gas, a mixture thereof, or a mixture of either or both of these gases with a gas such as $N_2$, $H_2$ and/or $NH_3$.

To reduce damage to the low-k ILD materials caused by the ashing process, the gas pressures are often kept at a relatively low levels. Unfortunately, these ashing processes are often less effective than processes performed at higher gas pressures. As a result, ashed material may be re-deposited along the top and bottom periphery of the wafer as well as along the wafer edges. The re-deposited material can become a source of particle flaking that can adversely impact the overall IC manufacturing process.

Accordingly, it would be desirable to provide a method and apparatus for removing such re-deposited ashed materials that accumulate on a semiconductor wafer.

SUMMARY OF THE INVENTION

In accordance with the present invention, a surface processing method is provided. The method includes supporting a wafer in a vacuum chamber and generating a plasma in a confined portion of the chamber over only a selected portion of the wafer to thereby perform a surface processing treatment on the selected portion of the wafer. While the plasma is being generated, the wafer and the confined portion of the chamber are displaced with respect to one another to thereby perform the surface processing treatment on a second selected portion of the wafer.

In accordance with one aspect of the invention, the displacement is performed by rotating the wafer on a sample holder about a central axis of the wafer while the plasma remains in a fixed location in the confined portion of the chamber.

In accordance with another aspect of the invention, the displacement includes repositioning the wafer to expose an edge of the wafer to the plasma.

In accordance with another aspect of the invention, the first and second selected portions of the wafer define a substantially complete periphery of the wafer.

In accordance with another aspect of the invention, the complete periphery of the wafer includes a top and bottom periphery of the wafer.

In accordance with another aspect of the invention, the first and second selected portions of the wafer include an edge of the wafer.

In accordance with another aspect of the invention, an exhaust gas is supplied over the wafer to prevent contaminated processing gases from flowing over portions of the wafer other than the first and second selected portions.

In accordance with another aspect of the invention, the surface processing treatment is an ashing process.

In accordance with another aspect of the invention, the surface processing treatment is an etching process.

In accordance with another aspect of the invention, the surface processing treatment is a film deposition process.

In accordance with another aspect of the invention, prior to generating the plasma over the selected portion of the wafer, an initial ashing process is performed on substantially an entire surface of the wafer.

In accordance with another aspect of the invention, the initial ashing process is a plasma etching process.

In accordance with another aspect of the invention, the surface processing treatment is performed to remove a resist mask previously formed on the wafer.

In accordance with another aspect of the invention, the surface processing treatment is part of a process to form a dual damascene structure.

In accordance with another aspect of the invention, a surface processing apparatus is provided that includes a vacuum chamber for processing semiconductor materials and a rotatable support for supporting a wafer within the vacuum chamber so that the wafer is selectively rotatable. A plasma discharge device is provided for generating a plasma in a confined portion of the chamber over only a peripheral and edge portion of the wafer to thereby perform a surface processing treatment on the peripheral portion of the wafer while the wafer is being rotated by the rotatable support.

In accordance with another aspect of the invention, a gas supply is provided for supplying an exhaust gas that diffuses over the wafer to prevent contaminated processing gases from flowing over portions of the wafer other than the first and second selected portions and an exhaust manifold for removing the exhaust gas.

DETAILED DESCRIPTION

Figure 1:
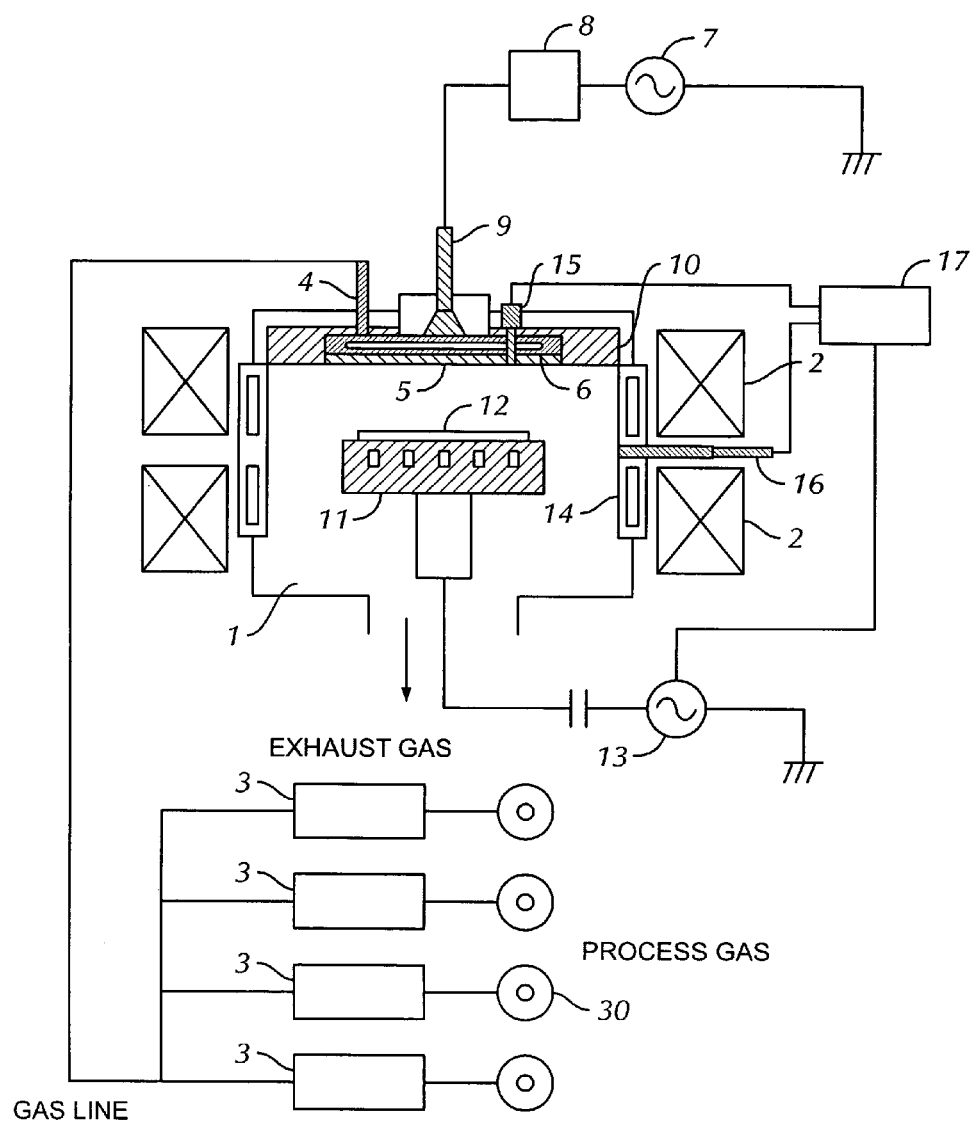
FIG. 1 shows one example of an ashing apparatus that may be employed in the present invention.

The methods and structures described herein do not form a complete process for manufacturing semiconductor device structures. The remainder of the process is known to those of ordinary skill in the art and, therefore, only the process steps and structures necessary to understand the present invention are described herein.

In general, the final structures to be formed in part by the processes of the present invention include microelectronic devices, such as highly integrated circuit semiconductor devices, processors, micro electromechanical (MEM) devices, optoelectronic devices, and display devices. In particular, the present invention is highly useful for devices requiring high-speed characteristics, such as central processing units (CPUs), digital signal processors (DSPs), combinations of a CPU and a DSP, application specific integrated circuits (ASICs), logic devices, and SRAMs.

The present invention can be applied whenever it is necessary to remove ashing residue after an initial ashing process is used to remove a resist layer formed on a wafer. Ashing is a method which is performed for removing a resist mask formed on a substrate through at least an insulating film. For example, the invention may be employed after a pattern is etched is a low-k material and before deposition of a conductive material. As another example, the invention may be used after deposition of a carbon doped low-k material but before lithography is performed. For purposes of illustration only and not as a limitation on the invention, after describing the principles of the invention, a process example will be presented in which the invention will be described in terms of an ashing process that is performed during formation of dual damascene structure that employs a low-k dielectric material.

It should be noted at the outset that the present invention is not limited to the removal of ashing residual but is more generally applicable to removal of any contaminants or residues that may accumulate on the periphery or edge of the wafer. Additionally, the present invention is also applicable to film deposition processes generally during which the peripheral and edge portions of the wafer are sometimes damaged during regular processing for a number of different reasons. For instance, resist material may not completely cover the entire wafer where etching is performed. Also, certain manufacturing tools clamp the wafer at its edge so that this area tends to be mechanically damaged. In other cases, CMP (chemical-mechanical polishing) tools sometimes polish the periphery and edges of the wafer faster than the center-most portions of the wafer. As a result, the wafer periphery may become thinner while the center of the wafer becomes thicker. Such damage can be reduced or eliminated by first depositing a film over the peripheral and edge portions of the wafer for protection. For instance, a protective film may be deposited over the peripheral and edge portions of the wafer to prevent damage during CMP processes. Processing gases that may be employed to form such a protective film may include, without limitation, TEOS (tetra-ethoxy-silane), silane or other silicon-based gases.

FIG. 1 shows one example of an ashing apparatus that may be employed in the present invention. The ashing appratus is presented for purposes of illustration only and not as a limitation on the invention. More generally, any appropriate ashing apparatus may be employed, all of which may have various configurations and operate on different principles. Some examples include, without limitation, a cylindrical type apparatus, a parallel flat plate type apparatus, a hexode type apparatus, an effective magnetic field RIE type apparatus, an effective magnetic field microwave type apparatus, a microwave type apparatus and an ECR type apparatus. In general, the ashing apparatus will typically include at least a vacuum chamber, a lower electrode formed at a lower position in the vacuum chamber, a power source capable of applying RF electric power for activating a gas inside the vacuum chamber and a power source capable of applying RF electric power to a substrate.

The illustrative plasma processing apparatus shown in FIG. 1 employs electron cyclotron resonance (ECR). The plasma processing apparatus includes a processing chamber 1. Coils 2 are disposed around the processing chamber 1 to generate a magnetic field for electron cyclotron resonance (ECR). A gas for etching is supplied to the processing chamber 1 through a gas supply tube 4 that is connected to a series of gas sources 30 via mass flow controllers 3. The etching gas is introduced into the chamber 5 from a gas supply plate 5 made of silicon or glassy carbon that is provided with several hundred or more fine holes, each with a diameter of typically about 0.4 to 0.5 nm. A disc-like antenna 6 for radiating a UHF band microwave is disposed above the gas supply plate 5. The microwave is fed from a power source 7 through a matching circuit 8 and a lead-in axis 9 to the antenna 6. The microwave is radiated from around the antenna 6, and the resonance electric field in the space above the antenna 6 is introduced into the processing chamber through a dielectric member 10. The microwave frequency should generally be capable of making the electron temperature of the plasma as low as e.g., 0.25 eV to 1 eV, which falls within the range from 300 MHz to 1 GHz.

Under the gas supply plate 5, a wafer mounting electrode 11 is disposed, on which a wafer 12 is supported by e.g., electrostatic adsorption. A high frequency bias is applied from a high frequency power source 13 to the wafer mounting electrode 11 to draw ions in the plasma into the wafer 12. The plasma emission intensity of a reaction product and the changes in interference light may be observed by monitors 15 and 16 so that the end point of the process can be determined by a controller 17.

In operation, the processing chamber 1 is evacuated to a high vacuum, and a wafer is carried in by a carrier arm (not shown) from a carrying chamber and delivered onto the wafer mounting electrode 11. The carrier arm retreats, and the valve between the processing chamber 1 and the carrying chamber is closed. Then, the wafer mounting electrode 11 moves upward, and stops at a position suitable for etching and ashing. Next, a plasma is generated in the vacuum chamber by means of a plasma source to perform etching on the wafer. Then, ashing is performed to remove the mask material or the like. As previously noted, suitable processing gases that may be employed include oxygen gas, an ozone gas, a mixture thereof, or a mixture of either or both of these gases with a gas such as $N_2$, $H_2$ and/or $NH_3$. If contaminants or other residue are to be removed, appropriate gases may include, without limitation, fluorine, chlorine and bromine based gases.

Figure 2:
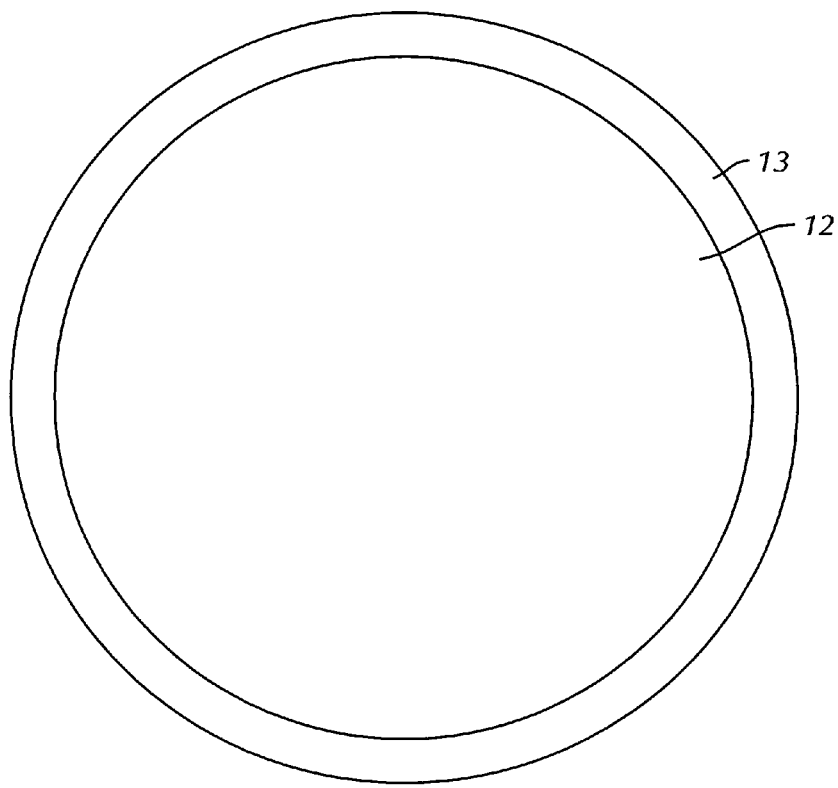
FIGS. 2 and 3 show a plan view and a side view, respectively, of a wafer.
Figure 3:
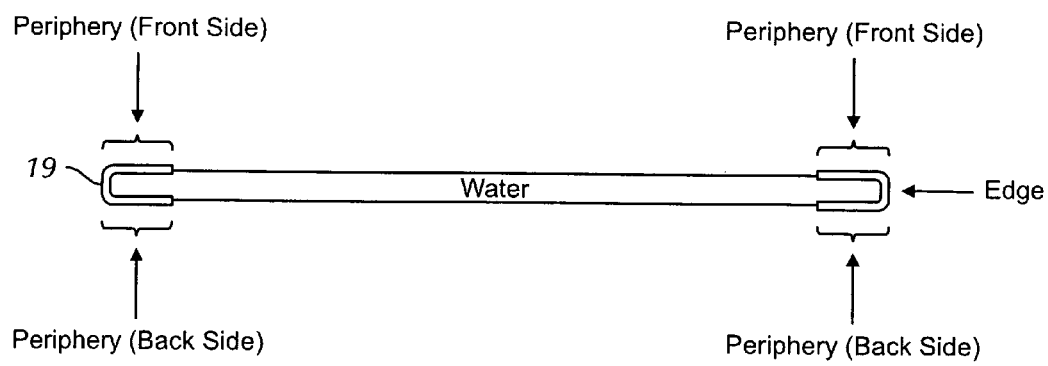

As previously mentioned, during an ashing process ashed material may be re-deposited along the top and backside periphery of the wafer as well as along the wafer edges. FIGS. 2 and 3 show a plan view and a side view, respectively, of a wafer 12 illustrating its peripheral surface portions 13 and edge 19. By way of example, on a wafer about 300 mm in diameter with a thickness between about 0.4 and 0.9 mm, the peripheral portion of the wafer on which material may be re-deposited may extend about 3-7 mm from the wafer edge 19. The re-deposited material can become a source of particle flaking that can adversely impact the resulting IC device. To remove the re-deposited material, the present invention applies a secondary plasma process only to the top and bottom or back periphery of the wafer and the wafer edge. This can be accomplished by forming a small discharge area that only applies the plasma to a relatively small portion of the periphery of the wafer. The wafer is then rotated so that its entire periphery 13, as well as its edge, is exposed to the plasma but not the central-most portion of the wafer. In this way only these peripheral and edge portions of the wafer undergo the secondary ashing process. In addition, to prevent contamination to the rest of the wafer, a gas flow may be generated within the chamber to prevent contaminated processing gases from diffusing over the central-most portion of the wafer that is not undergoing the secondary ashing process.

Figure 4:
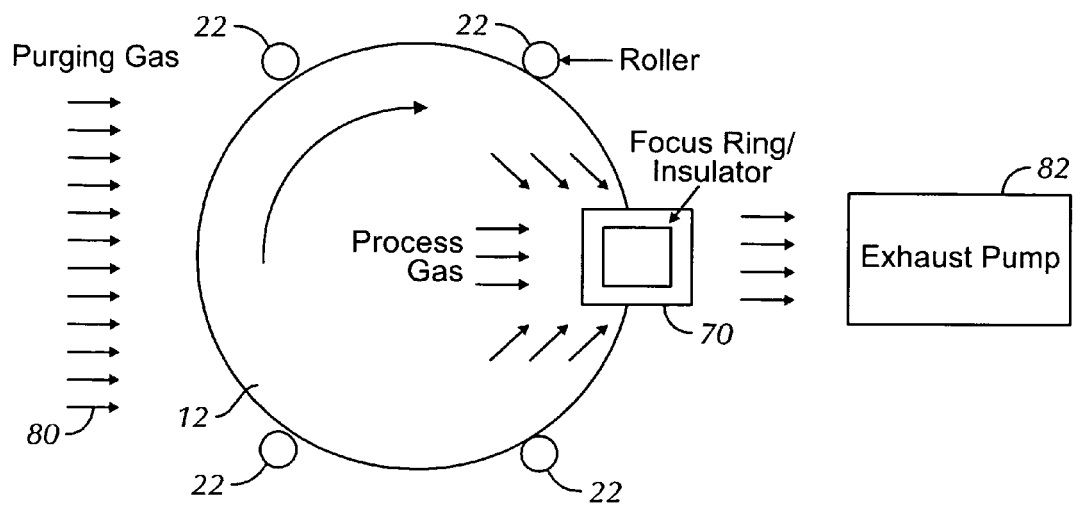
FIGS. 4 and 5 respectively show a plan view and a cross-sectional view of the pertinent portions of one example of a secondary ashing apparatus that may be employed in the present invention.
Figure 5:
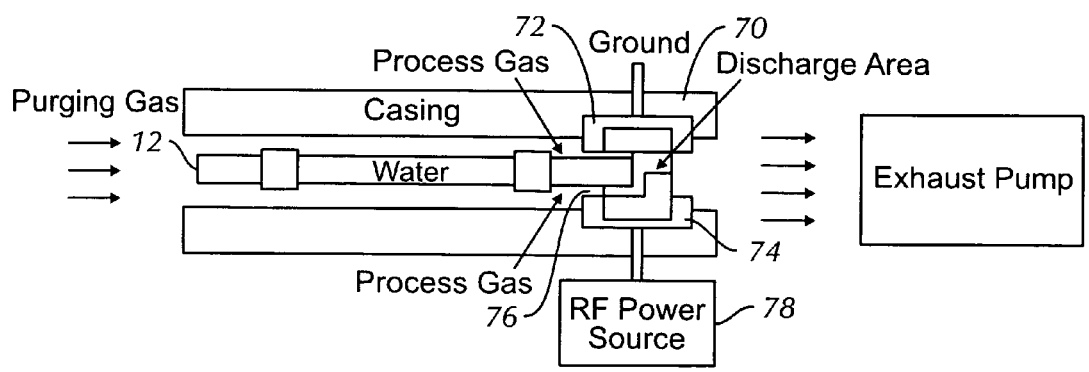

FIGS. 4 and 5 respectively show a plan view and a cross-sectional view of the pertinent portions of one example of a secondary ashing apparatus that may be employed in the present invention. The remaining details are well known to those of ordinary skill in the art and may be similar to those depicted in FIG. 1. The secondary apparatus may be incorporated directly into the primary ashing chamber shown in FIG. 1 (and employ many of the same components depicted in FIG. 1), or it may be located in a separate chamber. As shown, a wafer 12 is situated on a rotatable substrate holder (represented in FIGS. 4 and 5 by rollers 22) for rotating the wafer at one or more predetermined speeds. The substrate holder can rotate or spin the wafer about its central axis at any appropriate rate or rates. A peripheral portion of the wafer 12 is situated within an opening 76 of a plasma discharge device 70 defined by upper and lower electrodes 72 and 74. Opening 76 is sufficiently dimensioned to accommodate the peripheral portion of the wafer, including it's top and back sides. In this way these select portions of the wafer will be located within the plasma discharge area of the device 70. RF power source 78 is connected to one of the electrodes, in this case the lower electrode 74, to supply power to generate the plasma. The plasma discharge device 70 includes a focus ring or a magnetic field source for confining the plasma within the designated area so that it does not extend toward the remainder of the wafer 12 that is not to undergo the secondary ashing process.

In some cases, a mechanism may be provided to reposition the wafer 12 so that the wafer edge is more fully exposed to the plasma. The mechanism may be incorporated in the rotatable substrate holder so that the holder itself can be repositioned. Alternatively, a separate mechanism may be provided. For instance, the carrier arm or the like may be employed to reposition the wafer 12 in an appropriate manner so that its edge is better exposed to the plasma.

Referring again to FIGS. 4 and 5 a purging gas (represented by arrows 80) may be supplied by gas injectors (not shown). The gas 80 is supplied from the side of the chamber remote from the plasma discharge device 70. Appropriate purging gases may be selected by those of ordinary skill in the art. The purging gas flows over the wafer 12 and prevents contaminated processing gases from diffusing back over the wafer 12. An exhaust manifold 82 is provided for removing the purging gas from the chamber.

One application of the present invention is to the fabrication of a dual damascene interconnection, an example of which will now be described with reference to FIGS. 6 through 14. Herein, an opening exposing a lower interconnection is referred to as a via, and a region where interconnections will be formed is referred to as a trench. Hereinafter, the present invention will be described by way of an example of a via-first dual damascene process. However the present invention is also applicable to other dual damascene processes as well.

Figure 6:
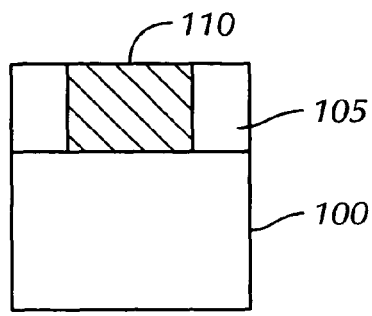
FIGS. 6-14 show cross-sectional views illustrating the formation of a dual damascene structure constructed in accordance with the present invention.

As shown in FIG. 6, a substrate 100 is prepared. A lower ILD layer 105 including a lower interconnection 110 is formed on the substrate 100. The substrate 100 may be, for example, a silicon substrate, a silicon on insulator (SOI) substrate, a gallium arsenic substrate, a silicon germanium substrate, a ceramic substrate, a quartz substrate, or a glass substrate for display. Various active devices and passive devices may be formed on the substrate 100. The lower interconnection 110 may be formed of various interconnection materials, such as copper, copper alloy, aluminum, and aluminum alloy. The lower interconnection 110 is preferably formed of copper because of its low resistance. Also, the surface of the lower interconnection 110 is preferably planarized.

Figure 7:
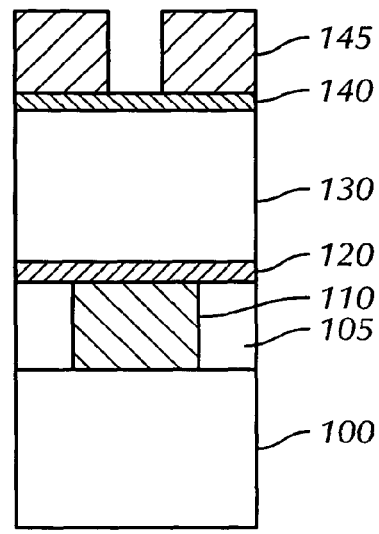

Referring to FIG. 7, a barrier or etch stop layer 120, a low-k ILD layer 130, and a capping layer 140 are sequentially stacked on the surface of the substrate 100 where the lower interconnection 110 is formed, and a photoresist pattern 145 is formed on the capping layer 140 to define a via.

The barrier or etch stop layer 120 is formed to prevent electrical properties of the lower interconnection 110 from being damaged during a subsequent etch process for forming a via. Accordingly, the etch stop layer 120 is formed of a material having a high etch selectivity with respect to the ILD layer 130 formed thereon. In an exemplary embodiment, the etch stop layer 120 is formed of SiC, SiN, or SiCN, having a dielectric constant of 4 to 5. The etch stop layer 120 is as thin as possible in consideration of the dielectric constant of the entire ILD layer, but thick enough to properly function as an etch stop layer.

The ILD layer 130 is formed of a hybrid low-k dielectric material, which has advantages of organic and inorganic materials. That is, the ILD layer 130 is formed of a hybrid low-k dielectric material having low-k characteristics that can be formed using a conventional apparatus. The ILD layer 130 has a low dielectric constant (e.g., 3.3 or less). The ILD layer 130 may be formed of an organosilicon compound such as octamethylcyclotetrasiloxane, (OMCTS) or 1,3,5,7-tetramethylcyclotetrasiloxane (TMCTS), for example. More generally, other organosilicon compounds having ring, linear or fullerene structures may be alternatively employed.

The ILD layer 130 may be formed by introducing a processing gas that includes the organosilicon compound into a processing chamber such as a chemical vapor deposition (CVD) chamber, and more specifically, a plasma-enhanced CVD (PECVD) chamber. The ILD layer 130 is formed to a thickness of about 3,000 angstroms to 20,000 angstroms or other appropriate thicknesses determined by those skilled in the art.

In general, the deposition process parameters used to form the ILD layer 130 using a PECVD process chamber may be readily determined by those of ordinary skill in the art. Such process parameters include wafer temperature, chamber pressure, OMCTS precursor gas flow rate, oxygen enhancement gas flow rate, inert carrier gas flow rate, and RF power level. Helium (He), argon (Ar), nitrogen ($N_2$), or combinations thereof, among others, may be used to form the plasma.

Referring again to FIG. 7, capping layer 140 is formed over ILD layer 130. The capping layer 140 prevents the ILD layer 130 from being damaged when dual damascene interconnections are planarized using chemical mechanical polishing (CMP). The capping layer 140 also serves as a hardmask during the subsequent etching steps used to form the via and trench. The capping layer 140 may be formed of $SiO_2$, SiOF, SiON, SiC, SiN, or SiCN. For example, in conventional processes an organosilicon compound such as tetraethoxysilane (TEOS) is used to form an $SiO_2$ capping layer by PECVD.

Figure 8:
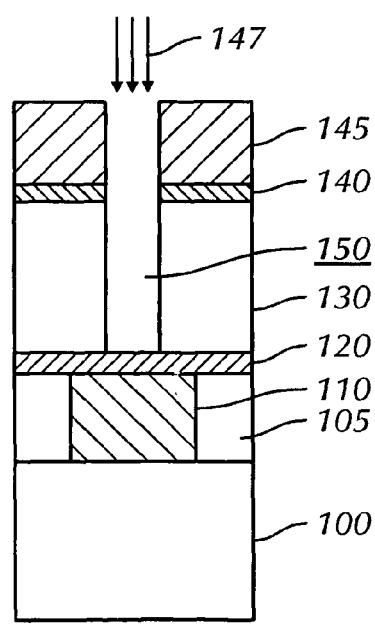

After formation of ILD layer 130 and capping layer 140, the process continues by forming the via photoresist pattern 145 by depositing a layer of a photoresist and then performing exposure and developing processes using a photo mask defining a via. Referring to FIG. 8, the ILD layer 130 is anisotropically etched (147) using the photoresist pattern 145 as an etch mask to form a via 150. The ILD layer 130 can be etched, for example, using a reactive ion beam etch (RIE) process, which uses a mixture of a main etch gas (e.g., $C_xF_y$ and $C_xH_yF_z$), an inert gas (e.g. Ar gas), and possibly at least one of $O_2$, $N_2$, and $CO_x$. Here, the RIE conditions are adjusted such that only the ILD layer 130 is selectively etched and the etch stop layer 120 is not etched.

Figure 9:
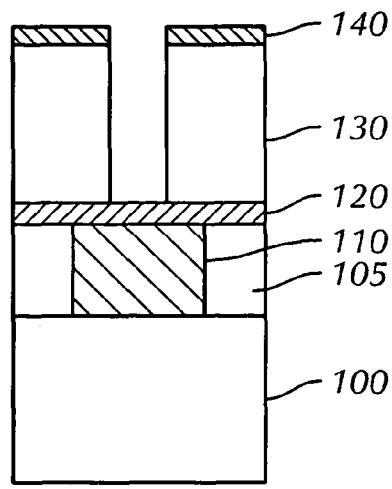

Referring to FIG. 9, the via photoresist pattern 145 is removed using an ashing, process such as an $O_2$ ashing process. If the ILD layer 130 contains carbon, it may be damaged by the $O_2$-based plasma. Thus, the photoresist pattern 145 alternatively may removed using an $H_2$-based ashing plasma process or some other appropriate processing gas. After performing a primary ashing process in a conventional manner, a secondary ashing process is performed in the manner described above to remove any re-doposited ashing material that may accumulate on the periphery or edge of the wafer.

Figure 10:
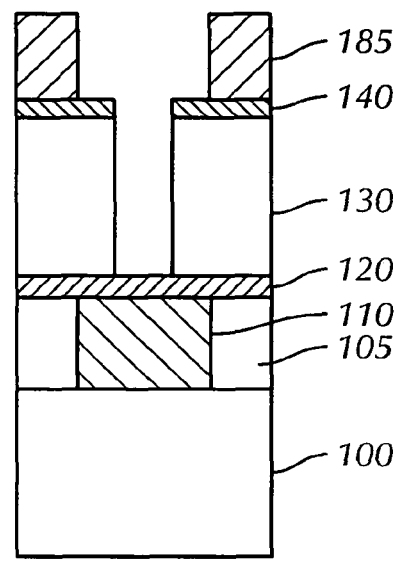
Figure 11:
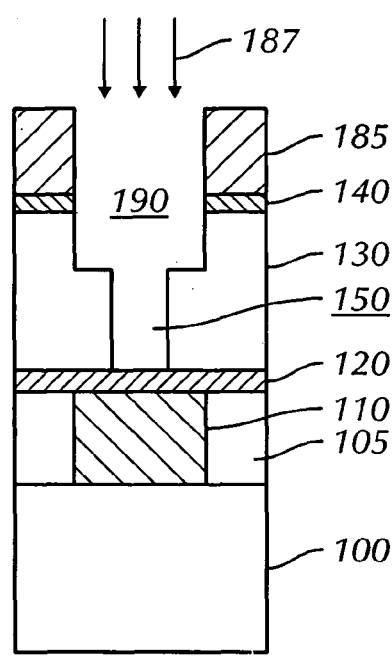
Figure 12:
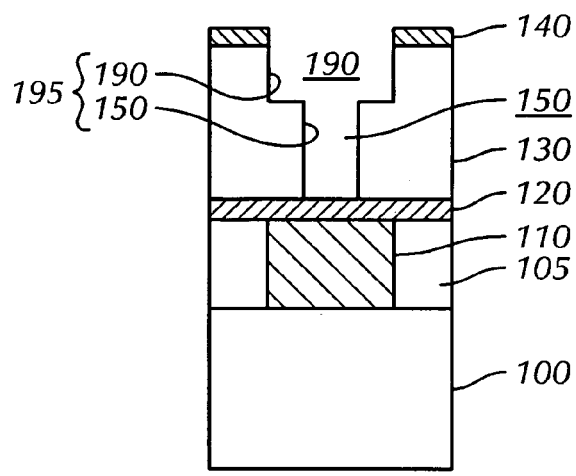

Next, referring to FIG. 10, after the ashing process a trench photoresist pattern 185 is formed, followed by formation of a trench 190 in FIG. 11. The capping layer 140 is etched using the photoresist pattern 185 as an etch mask, and then the ILD layer 130 is etched to a predetermined depth to form the trench 190. The resulting structure, shown in FIG. 12, defines a dual damascene interconnection region 195, which includes the via 150 and the trench 190.

Figure 13:
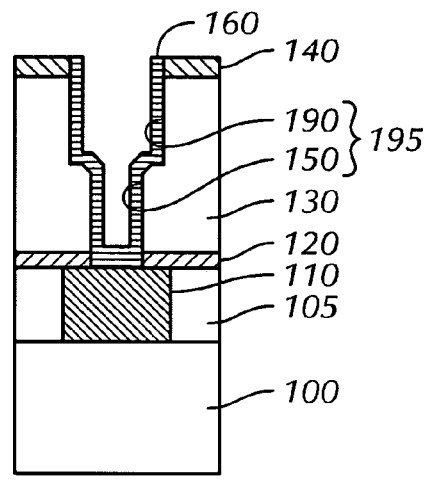

Referring to FIG. 13, the etch stop layer 120 exposed in the via 150 is etched until the lower interconnection 110 is exposed, thereby completing the dual damascene interconnection region 195. The etch stop layer 120 is etched so that the lower interconnection 110 is not affected and only the etch stop layer 120 is selectively removed.

Figure 14:
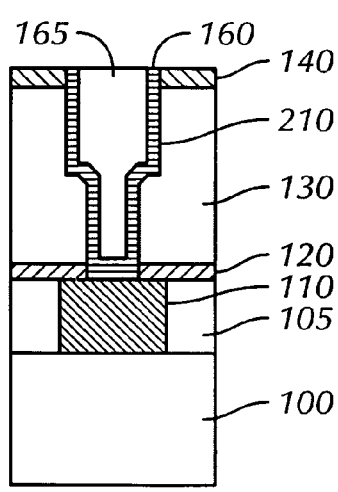

A barrier layer 160 is formed on the dual damascene interconnection region 195 to prevent the subsequently formed conductive layer from diffusing into ILD layer 130. The barrier layer 160 is generally formed from a conventional material such as tantalum, tantalum nitride, titanium, titanium silicide or zircuonium. After formation of the barrier layer 160 the copper conductive layer is formed on the barrier layer by an electroplating process. Referring to FIG. 14, the bulk copper layer 165 is formed on the dual damascene interconnection region 195 by electroplating and then planarized, thereby forming a dual damascene interconnection 210.

Although various embodiments are specifically illustrated and described herein, it will be appreciated that modifications and variations of the present invention are covered by the above teachings and are within the purview of the appended claims without departing from the spirit and intended scope of the invention.

The invention claimed is:

1. A surface processing method, comprising:
   supporting a wafer in a vacuum chamber;
   generating a plasma in a confined portion of the chamber over only a selected portion of the wafer to thereby perform a surface processing treatment on the selected portion of the wafer, wherein the surface processing treatment is an ashing process, and wherein, prior to generating the plasma over the selected portion of the wafer, performing an initial ashing process on substantially an entire surface of the wafer; and
   while the plasma is being generated, displacing the wafer and the confined portion of the chamber with respect to one another to thereby perform the surface processing treatment on a second selected portion of the wafer.

2. The method of claim 1 wherein the displacement is performed by rotating the wafer on a sample holder about a central axis of the wafer while the plasma remains in a fixed location in the confined portion of the chamber.

3. The method of claim 1 wherein the displacement includes repositioning the wafer to expose an edge of the wafer to the plasma.

4. The method of claim 1 wherein the first and second selected portions of the wafer include an edge of the wafer.

5. The method of claim 1 further comprising the step of supplying an exhaust gas over the wafer to prevent contaminated processing gases from flowing over portions of the wafer other than the first and second selected portions.

6. The method of claim 1 wherein the initial ashing process is a plasma etching process.

7. The method of claim 1 wherein the surface processing treatment is performed to remove a resist mask previously formed on the wafer.

8. The method of claim 1 wherein the surface processing treatment is part of a process to form a dual damascene structure.

9. The method of claim 1 wherein the first and second selected portions of the wafer define a substantially complete periphery of the wafer.

10. The method of claim 9 wherein the complete periphery of the wafer includes a top and bottom periphery of the wafer.

11. A surface processing method, comprising:
    supporting a wafer in a vacuum chamber;
    generating a plasma in a confined portion of the chamber over only a selected portion of the wafer to thereby perform a surface processing treatment on the selected portion of the wafer, wherein the surface process treatment is a film deposition process; and while the plasma is being generated, displacing the wafer and the confined portion of the chamber with respect to one another to thereby perform the surface processing treatment on a second selected portion of the wafer.

* * * * *